United States Patent
Kornilovich et al.

(10) Patent No.: US 8,695,501 B2
(45) Date of Patent: Apr. 15, 2014

(54) METHOD OF FORMING A CONTACT PRINTING STAMP

(75) Inventors: Pavel Kornilovich, Corvallis, OR (US); Peter Mardilovich, Corvallis, OR (US); Kevin F Peters, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2297 days.

(21) Appl. No.: 11/046,321

(22) Filed: Jan. 28, 2005

(65) Prior Publication Data

US 2006/0169160 A1 Aug. 3, 2006

(51) Int. Cl.
*G03F 7/00* (2006.01)
(52) U.S. Cl.
USPC ....................................................... 101/401.1
(58) Field of Classification Search
None
See application file for complete search history.

(56) References Cited

U.S. PATENT DOCUMENTS

| | | | |
|---|---|---|---|
| 5,512,131 A | 4/1996 | Kumar | |
| 6,060,121 A | 5/2000 | Hidber | |
| 6,365,059 B1 | 4/2002 | Pechenik | |
| 6,407,443 B2 * | 6/2002 | Chen et al. | 257/616 |
| 6,518,194 B2 | 2/2003 | Winningham | |
| 6,547,940 B2 | 4/2003 | Aksay | |
| 6,599,824 B1 | 7/2003 | Krivokapic | |
| 6,709,929 B2 | 3/2004 | Zhang | |
| 6,755,984 B2 | 6/2004 | Lee | |
| 6,764,833 B1 | 7/2004 | Yeatman | |
| 7,407,738 B2 * | 8/2008 | Kornilovich et al. | 430/322 |
| 2003/0213382 A1 | 11/2003 | Kendale | |
| 2004/0163758 A1 | 8/2004 | Kagan | |

FOREIGN PATENT DOCUMENTS

WO   WO 2004/012234   2/2004

OTHER PUBLICATIONS

Jung; Fabrication of a 34×34 crossbar structure at 50 nm Half-pitch by UV-based Nanoimprint Lithography; Nano Letters 2004, vol. 4, No. 7, p. 1225-1229.
Jung; Fabrication of molecular-electronic circuits by nanoimprint lithography at low temperatures and pressures; Applied Physics A 2004, p. 1169-1173.
Austin; Fabrication of 5nm linewidth and 14 nm pitch features by nanoimprint lithography; Applied Physics Letters 2004, vol. 84, No. 26, p. 5299-5301.
Kumar; Features of gold having micrometer to centimeter dimensions can be formed through a combination of . . . ; Applied Physics Ltrs, Oct. 4, 1993, vol. 63, No. 14, p. 2002-2004.
Melosh; Ultrahigh-density nanowire lattices and circuits; Science Mag, Apr. 4, 2003, vol. 300, p. 112-115.
Michel; Printing meets lithography: Soft approaches to high-resolution patterning; IBM J. Res & Dev, Sep. 5, 2001, vol. 45, No. 5, p. 697-719.
Ennis; Super hardening of W/NbN Nanolayers under shallow nanoindentation; Thesis-BSME, Univ of Pittsburgh, 2002, 60pgs.
Chappell Brown; "Nanowire array manufacturing becoming a 'Snap'"; EE Times On-line; http://eetimes.com/article/showArticle.jhtml?articleId=18308245&printable=true; Apr. 23, 2003.

* cited by examiner

Primary Examiner — Joshua D Zimmerman

(57) ABSTRACT

A method of forming a contact printing stamp, including creating a stamp material in a plurality of recessed regions formed in an exposed end-region of a multilayer thin film structure. The stamp material having a printing surface adapted to transfer a transfer material.

52 Claims, 11 Drawing Sheets

METHOD OF FORMING A CONTACT PRINTING STAMP

CROSS-REFERENCE TO RELATED APPLICATION

This application is related to co-pending and commonly assigned application Ser. No. 11/046,107 filed on the same day herewith by Pavel Kornilovich, Peter Mardilovich, and Kevin F. Peters and entitled "Method of Utilizing a Contact Printing Stamp."

BACKGROUND

Description of the Art

Over the past few years, the demand for ever cheaper and lighter weight portable electronic devices has led to a growing need to manufacture durable, lightweight, and low cost electronic circuits of increasing complexity, including high density memory chips. To a large extent, over the past thirty years, this growth has been fueled by a nearly constant exponential increase in the capabilities of microelectronic devices; producing unprecedented advances in computational, telecommunication, and signal processing capabilities. In turn, this increase in complexity has driven a corresponding decrease in the feature size of integrated circuit devices, which has typically followed "Moore's Law." However, the continued decrease in feature size of integrated circuits, into the nanometer regime, has become increasingly more difficult, and may be approaching a limit, because of a combination of physical and economic reasons. Nanometer scale devices have been found particularly suited for use in small or densely structured devices, such as sensors, microprocessors, memory devices, logic chips, and displays. A similar evolution towards decreasing feature size has begun in the field of bio-analytical microarrays, particularly for genomic and more recently proteomic tests.

Prior proposed solutions to the problem of fabricating nanometer-scale devices have typically fallen into two broad categories, one general area can be described as new patterning techniques, and the other general area involves new materials having nanometer-scale dimensions. New patterning techniques include both projection systems utilizing electromagnetic radiation, and direct write systems utilizing particle beams, or scanning probes. Some of the newer higher resolution projection systems require expensive radiation sources such as synchrotrons. On the other hand direct write systems, typically, require a serial process of individually writing each structure in contrast to exposing many structures at one time utilizing projection systems. Thus, direct write systems, typically, have a much lower throughput when compared to projection systems again leading to either increased complexity in manufacturing or increased cost or both.

Recently to address this need for nanometer scale devices etched multilayer structures, sometimes referred to as a superlattice, have been used. An example of using an etched, superlattice stamp to perform imprint lithography is described in U.S. Pat. No. 6,407,443. This example of imprint lithography uses a nano-imprinting step, which has so far not been consistently and successfully used in a manufacturing process. In addition, this example also includes lithographic materials and several processes that may limit its process capability. Finally, another approach utilizes materials synthesized to have nanometer-scale dimensions to fabricate nanometer-scale devices. However, after these nanometer-scale materials are formed, they are often randomly arranged, either one end randomly attached to a substrate or both ends free. This randomness along with the difficulty of physically manipulating nanometer-sized components presents a significant challenge to the fabrication of reproducible and practical nanometer-scale devices.

If these problems persist, the continued growth, seen over the past several decades, in cheaper, higher speed, higher density, and lower power integrated circuits used in electronic devices will be impractical. Consumer demand for cheaper, smaller, more reliable, higher performance devices constantly puts pressure on improving and developing cheaper, and more reliable manufacturing materials and processes. There is an ever present need for lower cost electronic devices which make use of low cost materials, and low cost and relatively simpler manufacturing processes. The ability to optimize the formation of nanometer-scale devices, will open up a wide variety of applications that are currently either impractical or are not cost effective.

BRIEF DESCRIPTION OF THE DRAWINGS

FIG. 1b is an isometric view of a stamp material and a stamp base formed on the exposed end region of the multilayer thin film structure shown in FIG. 1a.

FIG. 2b is a cross-sectional view of a stamp material and a stamp base formed on an exposed end region of the multilayer thin film structure shown in FIG. 2a.

DESCRIPTION OF THE PREFERRED EMBODIMENTS

Figure 1A:
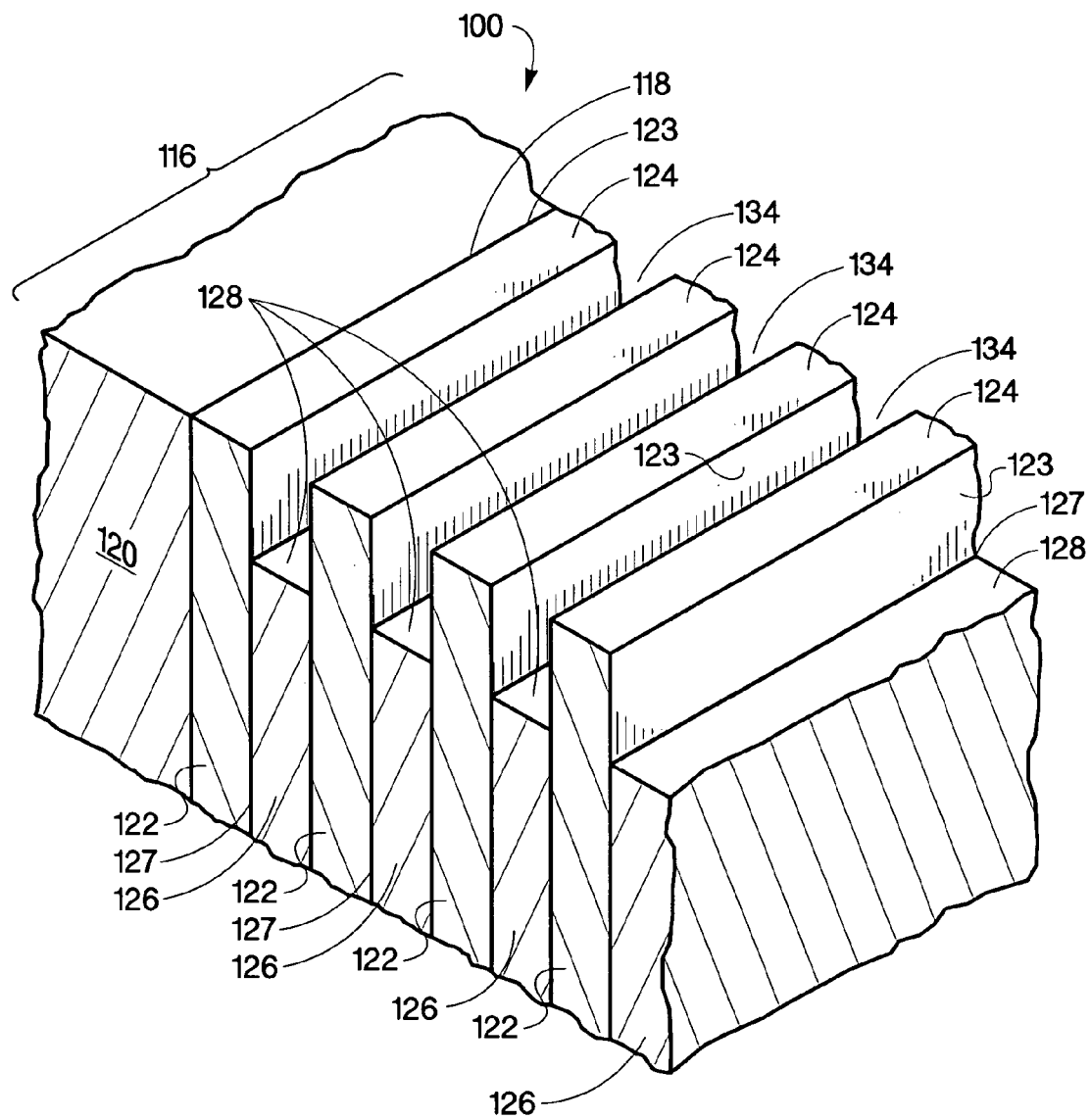
FIG. 1a is an isometric view of an exposed end region of a multilayer thin film structure according to an embodiment of the present invention.

This invention is directed to utilizing multilayer thin film structures, sometimes referred to as superlattices or periodic structures, to act as a template, mold, or some combination thereof to create a contact printing stamp. Typically, the present invention utilizes alternating layers of two dissimilar materials having differing etching or removal rates; however, multiple materials may be utilized in a multilayer thin film structure to generate even more complex template structures. The multilayer thin film structures of the present invention may be fabricated by a variety of techniques including physical vapor deposition, chemical vapor deposition, atomic layer deposition, evaporation techniques, and epitaxial growth techniques. In addition, the present invention enables a reduction in the characteristic feature size from approximately 80 nanometers to 2 or 3 nanometers or even lower. The present invention also allows for larger features, up to microns in characteristic feature size, to be fabricated and provided in perfect or substantially perfect registry with nanosized features; as well as providing a low-cost alternative method of fabricating features greater than 80 nanometers compared to conventional techniques. Nanoscale contact printing has the advantage that deposition of the useful material does not require the additional deposition of sacrificial materials, as typically required in other nanoscale lithographic methods. Further, by utilizing the multilayer thin film structure either as a contact printing stamp or as a template and mold to generate many contact printing stamps, the present invention provides for a less complex and cost effective technique to enable a lower cost manufacturable process for fabricating nanometer scale devices.

It should be noted that the drawings are not true to scale. Further, various elements have not been drawn to scale. Certain dimensions have been exaggerated in relation to other dimensions in order to provide a clearer illustration and understanding of the present invention. In particular, vertical and horizontal scales may differ and may vary from one drawing to another. In addition, although some of the embodiments illustrated herein are shown in two dimensional views with various regions having height and width, it should be clearly understood that these regions are illustrations of only a portion of a device that is actually a three dimensional structure. Accordingly, these regions will have three dimensions, including length, width, and height, when fabricated on an actual device.

Moreover, while the present invention is illustrated by various embodiments, it is not intended that these illustrations be a limitation on the scope or applicability of the present invention. Further, it is not intended that the embodiments of the present invention be limited to the physical structures illustrated. These structures are included to demonstrate the utility and application of the present invention to presently preferred embodiments.

Figure 1B:
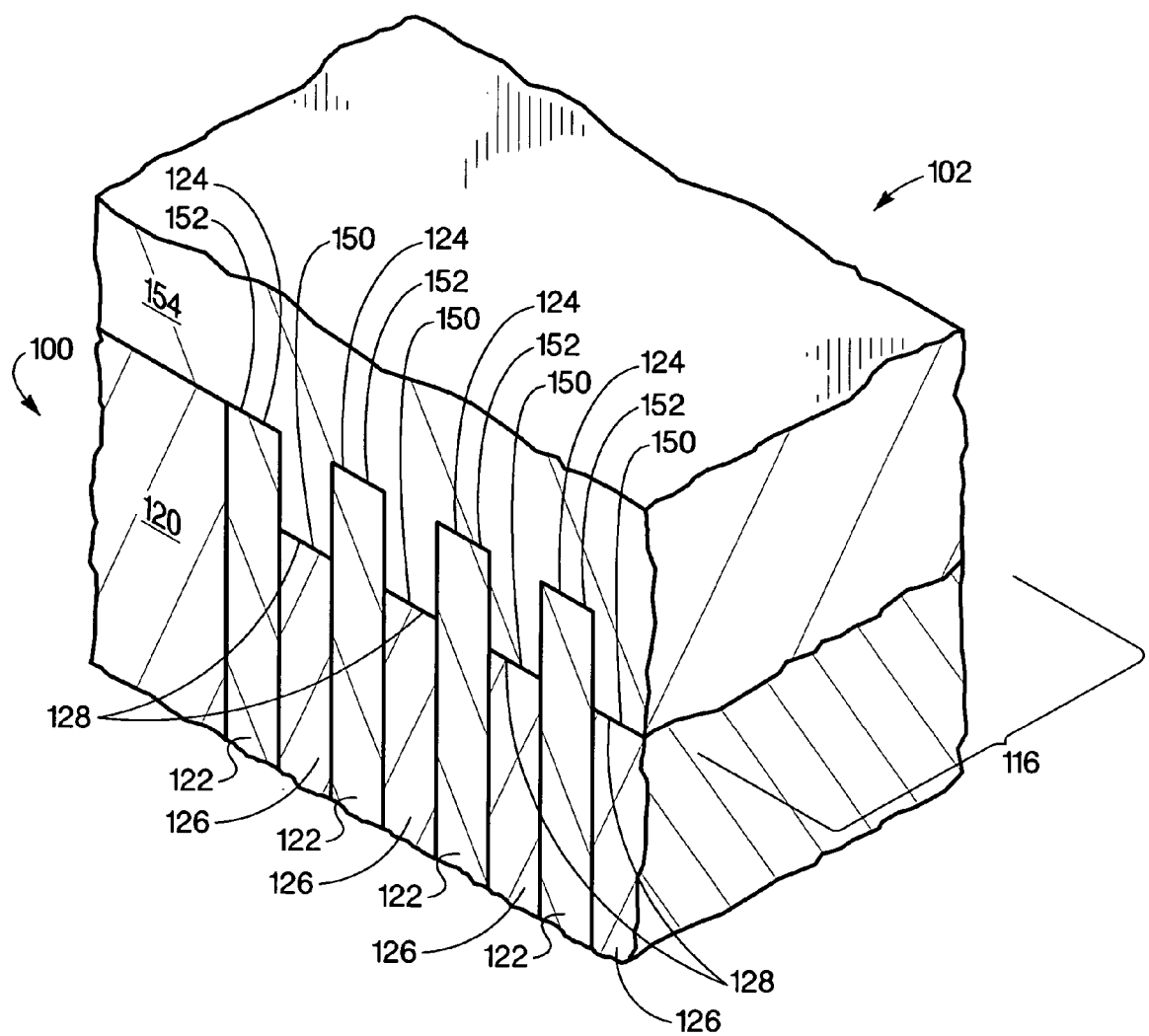

An isometric view of an exposed end region of multilayer thin film structure 100 utilized in the present invention is shown in FIG. 1a. Multilayer thin film structure 100 includes at least two or more different material layers, here as illustrated in FIGS. 1a-1b the multilayer thin film structure includes alternating first material layers 122 and second material layers 126 disposed on substrate 120. Substrate 120 includes substrate major surface 118, first material layers 122 include first material layer major surfaces 123, and second material layers 126 include second material layer major surfaces 127 in which first and second material layer major surfaces are parallel to that of substrate major surface 118. Although FIG. 1a shows first material layer 122 disposed on substrate 120 it should be understood that either layer may be disposed on the substrate, that additional layers may be disposed between substrate 120 and the first layer of the multilayer stack, and that in still other embodiments the use of substrate 120 is optional. A wide variety of deposition techniques may be utilized to fabricate the multilayer thin film structure, such as sputtering or other methods of physical vapor deposition; chemical vapor deposition including metallo-organic (MOCVD) or plasma enhanced (PECVD), as just two examples; atomic layer deposition, evaporation techniques, such as electron beam or thermal evaporation; electro deposition, such as electroplating, electroless deposition, and electrochemical oxidation; and epitaxial growth techniques (i.e. perfect or substantially perfect lattice registry of one material to another material upon which it is deposited), spin coating and other mechano-fluidic techniques; and the like. FIG. 1a, for illustrative purposes only, also shows first and second material layers 122 and 126 each having substantially the same thickness in the direction parallel to substrate major surface 118. In this embodiment, both the first and second material layers may be generated having different thicknesses as well as varying thicknesses, or combinations of both. Virtually, any combination of thicknesses may be utilized including from a few nanometers to micrometers in thickness and even thicker. The thickness or thicknesses utilized will be application specific and will depend both on the characteristic feature size or sizes to be formed in the molding process as well as the pitch or separation of the desired characteristic features. In one embodiment the thicknesses are less than about 80 nanometers. The present invention can be made to work with any dimension greater than a few nanometers, and need not be limited to the nanometer scale.

First and second material layers 122 and 126 may be formed utilizing most solid materials that can be deposited, formed, or various combinations thereof, into thin layers. In addition, first and second material layers 122 and 126 may themselves be formed utilizing multiple layers. A wide variety of elemental, binary, and multi-component materials may be utilized. Conductive materials, such as one or more metals, metal alloys, or cermets may be utilized. A few examples of metal include platinum, palladium, beryllium, aluminum, tantalum, tungsten, rhenium, rhodium, nickel, gold, and silver. A wide variety of conductive oxides also may be utilized such as indium tin oxide, vanadium oxide, or yttrium barium copper oxide. Semiconductive materials such as silicon, diamond, germanium, gallium arsenide, aluminum gallium arsenide, indium phosphide, cadmium telluride, zinc oxide, silicon carbide, tin oxide, indium tin oxide also may be utilized to form either the first or second layers or both. For example, alternating layers of boron-doped p-type silicon and phosphorus-doped n-type silicon may be utilized effectively, due in part to the layers' different etching rates. Non-conductive materials, such as polymeric and ceramic materials also may be utilized. A few examples of ceramic materials includes glasses, such as any of the borosilicate, soda lime or quartz glasses (including crystalline and amorphous glasses) as well as silicon oxides, nitrides, and silica mixed with oxides of, for example, potassium, calcium, barium or lead; other various nitrides, borides, and carbides such as boron nitride, silicon carbide, and sapphire. Examples of the wide variety of polymeric materials includes polyimides, polycarbonates, polyesters such as polyethylene terephthalate, polystyrene, and polyacrylates such as polymethylmethacrylate.

The choice of the material combination will be application-specific and will depend on various factors such as the differential etching or removal rates, the temperature stability, and the environmental conditions to which the material will be subjected. Both first and second material layers 122 and 126 also may be formed utilizing any combination of types of materials. A few non-limitative examples include both layers formed using metals, both ceramic, both semiconductive, one semiconductive and one metal, one polymeric and one ceramic, and one metal and one ceramic. In addition, both layers also may include more than one material, such as various combinations of nitrides and oxides, or a metal alloy, or various combinations of ceramics and metals, or combinations of polymeric materials.

As shown in FIG. 1a, multilayer thin film structure 100 also includes exposed end region 116 that includes recessed regions 134 formed in second material layer 126. Recessed regions 134 have a depth equal to the difference between first material edge 124 and second material edge 128. It should be understood that recessed regions 134, in the present invention, may be formed in any of the material layers or groups of layers. The particular layers chosen will depend on the particular application in which the contact printing stamp will be utilized. In this embodiment, recessed regions 134 may be formed utilizing various etching or material removal techniques and even combinations thereof. Non-limitative examples include wet or dry etching, or combinations of both, and ion milling. In those embodiments utilizing wet or dry etching or combinations of both the etching rate of one material relative to the other is generally immaterial so long as there is a differential etching rate between the materials chosen to fabricate the multilayer thin film structure.

Typically a differential etching rate of four to five times or even more times faster is employed to minimize the amount of etching of the material or materials utilized to form the layers not being etched. In addition, in those embodiments utilizing an anodizable metal forming either one or both layers, electrochemical oxidation may be utilized to oxidize the metal from the edge to a desired depth with subsequent etching of the electrochemically formed oxide to form recessed regions 134. For example, Al, Ta, and W may be anodized and their oxides may be selectively etched. For example, an etching solution that selectively etches the aluminum oxide formed during anodization of aluminum, includes a mixture of phosphoric acid ($H_3PO_4$), in the range of from about 5 weight percent to about 40 weight percent, chromium oxide ($CrO_3$), in the range of from about 2 weight percent to about 15 weight percent, and water. Typically, the selective etch is heated to a temperature in the range from about 80° C. to about 100° C. Further, in this embodiment, substrate 120 is shown in FIGS. 1a and 1b as being substantially co-planar with first material layer 122 and is for illustrative purposes only. It should be understood that substrate 120 may also be etched to form a recessed region or even removed. Whether substrate 120 is etched, forms a recessed region or is removed is application specific.

FIG. 1b, an isometric view, illustrates the formation of contact printing stamp 102 on exposed end region 116 of multilayer thin film structure 100. Contact printing stamp 102, in this embodiment, includes stamp protrusions 150 formed by creating a stamp material in recessed regions 134 (see FIG. 1a) of multilayer film structure 100. Stamp protrusions 150 end at second material edge 128 of multilayer thin film structure 100. Contact printing stamp 102 also includes stamp base 154, and it includes stamp indentations 152 corresponding to first material edge 124. Stamp base 154 is essentially that portion of the stamp distal to the stamp protrusions and indentations. Protrusions 150 and indentations 152 have a depth equal to the difference between first material edge 124 and second material edge 128 of multilayer thin film structure 100 from which they were formed. As described earlier for the multilayer thin film structure the length, width, and shape of the protrusions and indentations formed may be varied and is intended to include a wide range of lengths, widths and shapes. The desired structures of contact printing stamp 100 are represented by protrusions and indentations. In particular the length, width, and shape shown in FIG. 1b is meant for illustrative purposes only. Contact printing stamp 100 has a substantially complementary shape to the features or structures formed in multilayer thin film structure 100. By complementary, it is meant that the pattern formed in contact printing stamp 100 has a shape corresponding to the complement of the shape formed in multilayer thin film structure 100. In addition, exposed end region 116 of multilayer thin film structure 100 may also include a release layer disposed on first material edge 124 and on the surfaces forming recessed regions 134 including second material edge 128. A wide variety of surface modifying compounds or molecules may be utilized to form the release layer such as molecules having fluorinated hydrocarbon chains or polysiloxanes. Perfluorohexyl trichlorosilane, perfluorodecyl trichlorosilane, and perfluorohexylpropyl trichlorosilane are just a few non-limitative examples of compounds that may be utilized as a release layer.

In the embodiment shown in FIG. 1b stamp base 154 is formed utilizing the same material as that utilized to form stamp protrusions 150 and stamp indentations 152. However, in alternate embodiments stamp base 154 also may include additional materials including multiple layers, or gradients in composition or various combinations thereof. For example, stamp base 154 may include a soft cushion material disposed between a stiff material utilized to form the protrusions and indentations and a hard back plane material in which stamp base 154 is terminated. The exact demarcation between the stamp base and protrusions is application specific and will depend on various factors such as the Young's modulii of the material utilized to form the stamp, the aspect ratio (i.e. the height of the characteristic features divided by their lateral dimension), and the surface roughness and hardness of the surface onto which the stamp will transfer material. The material utilized to form protrusions 150 and indentations 152 may be any moldable material. That is any material that either flows or is pliable under a first condition and relatively solid and less pliable under a second condition may be utilized. Examples of non-polymeric materials that may be utilized for the stamp material include metals and metal alloys having melting points below the temperature at which first and second material layers 122 and 126 of multilayer thin film structure would be degraded or damaged. For example, the first and second material layers may be formed using high temperature ceramics when a contact printing stamp formed using a metal is desired. A wide variety of polymeric materials may be utilized to form contact printing stamp 100 in the present invention. Examples of various polymers that may be utilized include, various photo curable polymers, polymethyl methacrylate (PMMA), polycarbonates, polyimides, and siloxanes such as poly(dimethylsiloxane) (PDMS). However, it should be understood that these are just a few examples and are not meant to limit the present invention. For example, to create the stamp material in the recessed regions, poly(dimethylsiloxane) prepolymers, such as that sold by Dow Corning Incorporated under the name Sylgard 184 may be poured onto the exposed end region of the multilayer thin film structure and cured. Another example is PMMA that may be either solvent cast onto the exposed end region or heated above its softening or glass transition temperature and the exposed end region of the multilayer thin film structure is pressed or urged into the softened PMMA with subsequent cooling of the PMMA. This latter technique is commonly referred to as imprinting or embossing. The particular temperature and pressure utilized in the thermal imprinting process will depend on various parameters such as the size and shape of the features being molded. Still another example is the use of a polyamic acid solution poured onto the exposed end region and then cured chemically or thermally to form a polyimide.

Examples of photo-curable materials includes a material sold by Molecular Imprints Inc. under the name S-FIL Monomat Ac01, which may be cured by an exposure with I-line radiation (i.e. 365 nanometers) utilizing a photo source such as 100 Watt Hg—Se ultraviolet arc lamp. Another photo-curable material that may be utilized is a material that includes ethylene glycol diacrylate (3-acryloxypropyl)tris(trimethylsiloxy)silane, t-butyl acrylate, and 2-hydroxy-2-methyl-1-phenyl-propan-1-one.

Figure 1C:
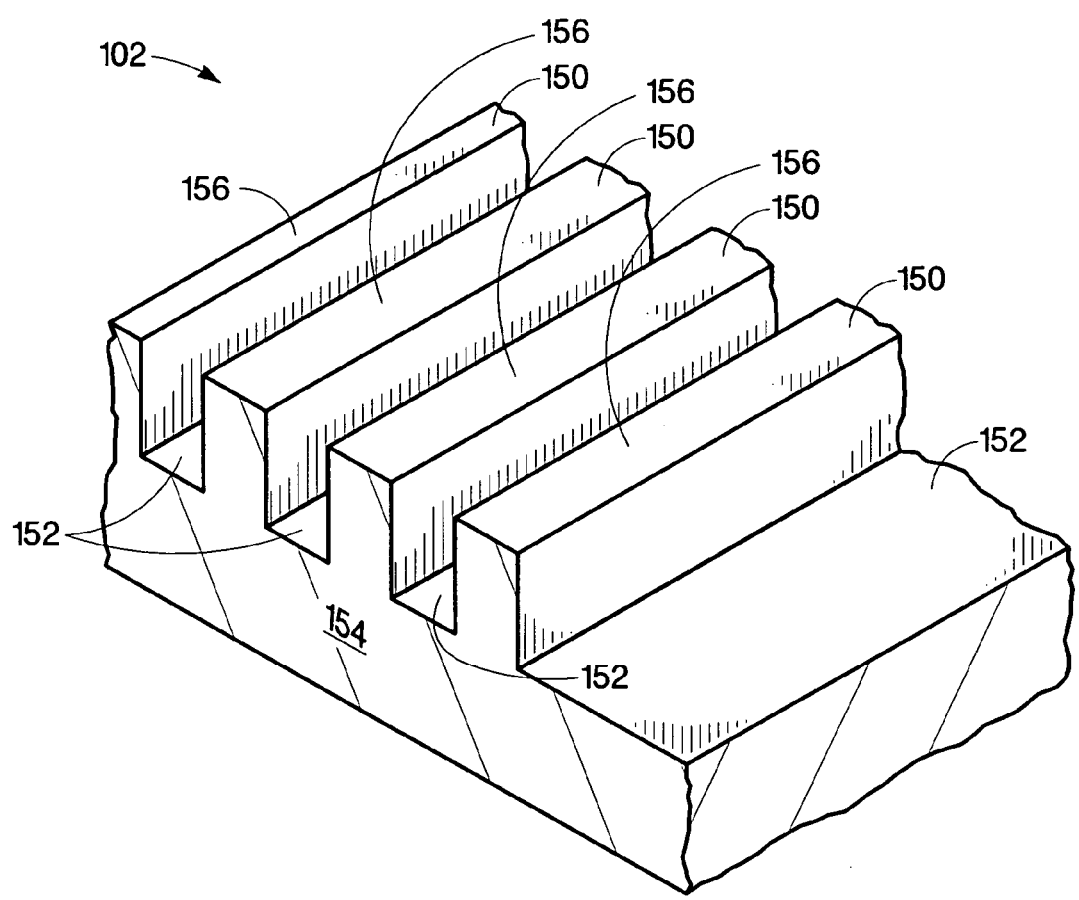
FIG. 1c is an isometric view of a contact printing stamp according to an embodiment of the present invention.

FIG. 1c, an isometric view, illustrates contact printing stamp 102 after separation or removal from multilayer thin film structure 100 (see FIGS. 1a and 1b). Contact printing stamp 102 includes protrusions 150 and indentations 152. Protrusions 150 form printing surfaces 156 through which patterning of a material surface may be carried out. As noted above the utilization of simple lines and spaces as shown in FIG. 1c is for illustrative purposes only and does not limit the type or shape of structures that may be formed on contact printing stamp 102. As will be described in greater detail below both curved and straight structures as well as combinations thereof may form printing surfaces 156. In addition, the square wave nature of the change from a protrusion to an indentation as illustrated in FIGS. 1a-1c also may be varied including triangular and sinusoidal as well as various combinations of the two. It should be understood that the present invention may utilize virtually any function in characterizing the change from a protrusion to an indentation and back, including substantially straight sidewalls with rounded corners. Contact printing stamp 102 also includes stamp base 154.

Figure 1D:
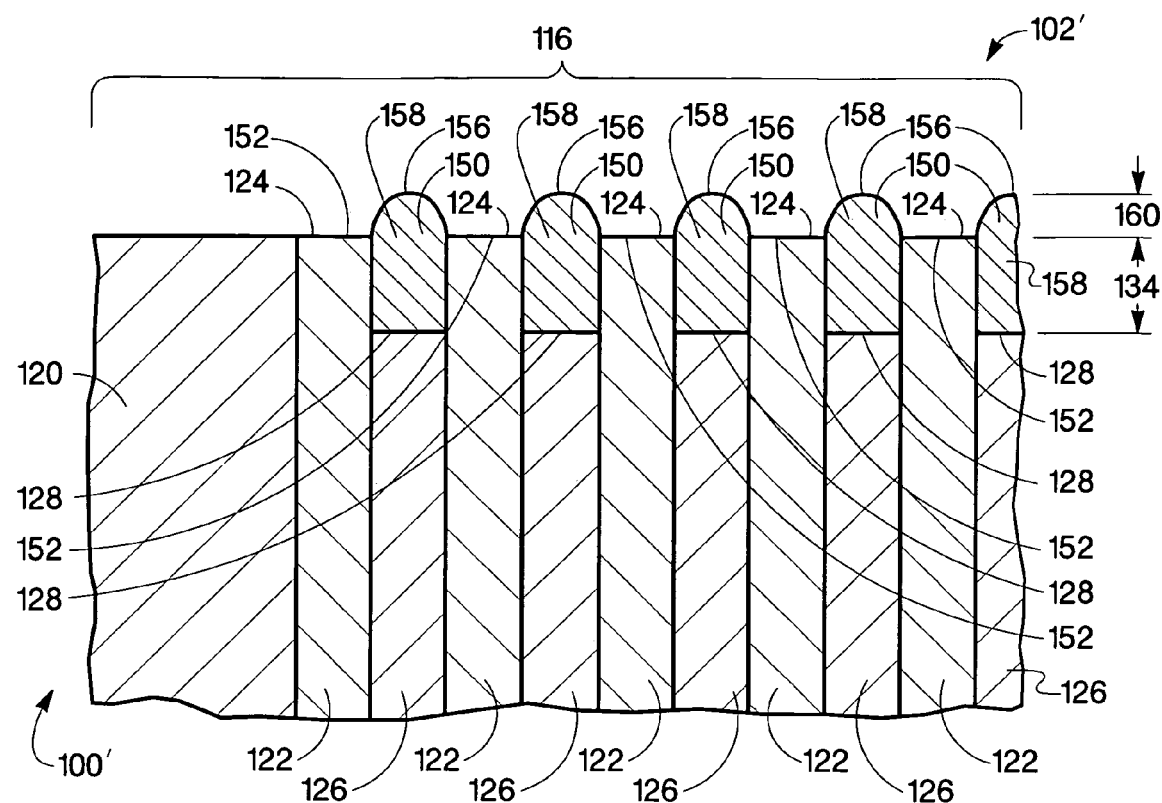
FIG. 1d is a cross-sectional view of a stamp material formed in an exposed end region of a multilayer thin film structure according to an alternate embodiment of the present invention.

An alternate embodiment of the formation of a contact printing stamp utilizing a multilayer thin film structure to form a portion of the contact printing stamp in the present invention is shown, in cross-sectional view in FIG. 1d. Multilayer thin film structure 100' may be the same or similar to the structure shown in FIG. 1a. In this embodiment, stamp material 158 is created in recessed regions 134 formed in exposed end region 116 of multilayer thin film structure 100'. The depth of recessed region 134 is the difference in height from first material edge 124 and second material edge 128. In this embodiment, stamp protrusion 150 and printing surface 156 are created by forming an excess amount of stamp material having substantially the same or smaller width as the width of recessed region 134 (e.g. the thickness of second material layer 126) and extending above first material edge 124 of first material layer 122. In such an embodiment, the combination of stamp material 158 and multilayer thin film structure 100' combine to form contact printing stamp 102'. However, it should be understood that the protrusion of stamp material 158 as shown in FIG. 1d illustrates only one way in which multilayer thin film structure 100' may be incorporated into a contact printing stamp. Stamp material 158 also may fill only a portion of the recessed regions, or the stamp material may self align or form a co-planar surface with first material edge 124, or even combinations thereof as will be explained below.

As described earlier the material utilized to create stamp material 158 may be any moldable material. That is any material that either flows or is pliable under a first condition and relatively solid and less pliable under a second condition may be utilized. Contact printing stamp 102' includes stamp protrusions 150 and stamp indentations 152 where stamp protrusion height 160 is the difference in height from first material edge 124 and printing surface 156 (i.e. stamp protrusion height is the excess amount of stamp material extending above first material edge 124). As described earlier for the multilayer thin film structure, shown in FIG. 1a, the length, width, and shape of the protrusions and indentations formed may be varied and is intended to include a wide range of lengths, widths and shapes. The desired structures of contact printing stamp 102' are represented by protrusions and indentations and in particular the width, and shape shown in FIG. 1b, as well as the length (not shown) is meant for illustrative purposes only.

Figure 1E:
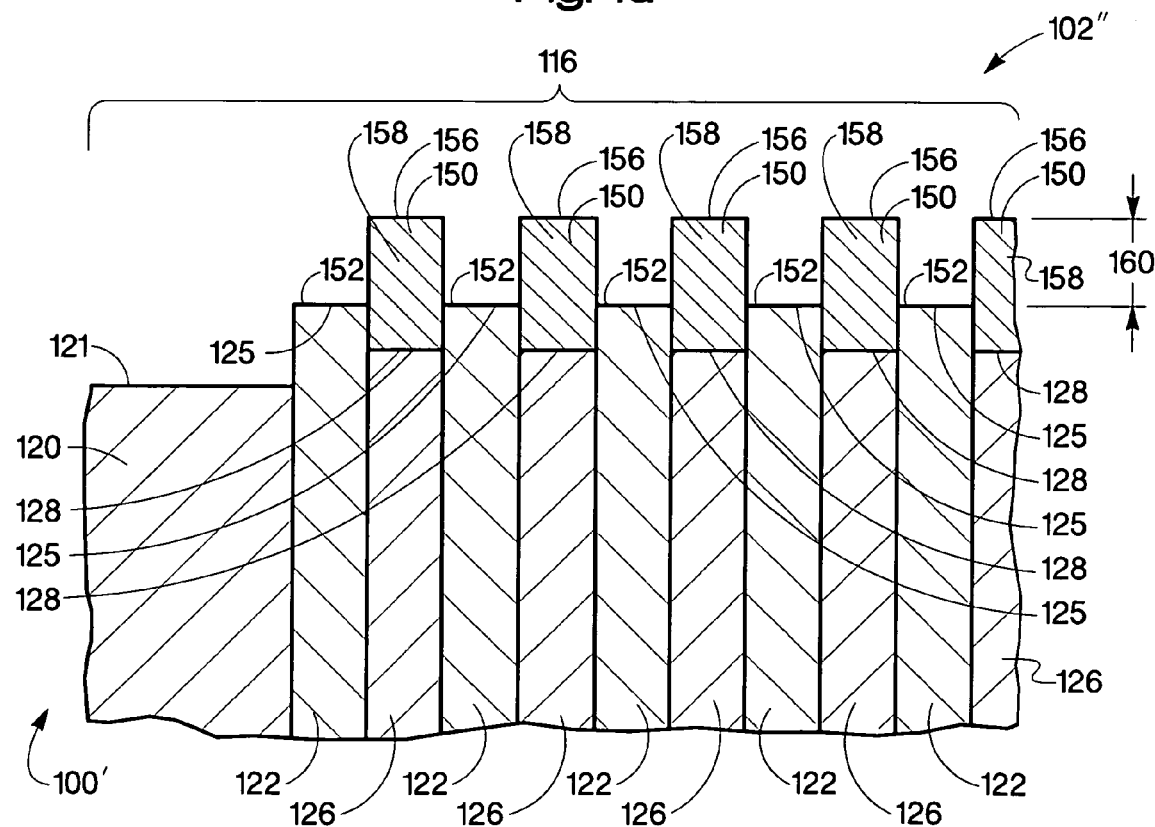
FIG. 1e is a cross-sectional view of a contact printing stamp according to an alternate embodiment of the present invention.

An alternate embodiment illustrating the use of a multilayer thin film structure as a contact printing stamp is shown, in a cross-sectional view, in FIG. 1e. Exposed end region 116 of contact printing stamp 102" may be planarized, after the creation of stamp material 158 in recessed regions 134 of exposed end region 116, for those embodiments in which stamp material 158 does not form a surface sufficient to generate a desired printing surface without further processing. For example, in those embodiments where a planar printing surface is desired and the stamp material does not form a co-planar surface with first material edge 124 (see FIG. 1d) planarization may be utilized to generate the planar surface. A wide variety of planarizing techniques may be utilized such as chemical mechanical polishing, or ion milling, or even combinations of both. The particular method utilized to planarize end region 116 will depend on a variety of factors such as the chemical and mechanical properties of the first and second material layers, the chemical and mechanical properties of the stamp material utilized, the depth of the recessed regions, and the size of the characteristic features being formed. In addition, the material layer or layers that do not form the recessed regions are also etched, removed, or various combinations of both, to a depth sufficient to generate printing surface 156 after stamp material 158 is created. For example, as illustrated in FIG. 1e, first material layers 122 (i.e. the layers that did not form the recessed regions) may be etched. Here first material layers 122 are etched to a depth intermediate to that of second material layers 126 forming first material etched second edge 125; however, in alternate embodiments other depths also may be utilized.

In the embodiment shown in FIG. 1e stamp material 158 may be planarized before first material layers 122 are etched; however, in alternate embodiments first material layers 122 may be etched before stamp material 158 is planarized, as well as other embodiments where combinations of etching or removal processes and planarization processes in various sequences may be utilized. In this embodiment, the edge of substrate 120 forming a portion of exposed end region 116 has also been etched, removed, or some combination thereof, to form etched substrate edge 121. In this embodiment, etched substrate edge 121 is at a depth below both first material etched second edge 125 and second material edge 128 formed in second material layer 126; however, in alternate embodiments the etched substrate edge may be at any depth that provides sufficient contact of printing surface 156 to effectuate the desired printing step. In still other embodiments, substrate 120 may be removed entirely. It should also be noted that, as shown in FIG. 1e, stamp material 158 is planarized essentially to that of first material edge 124 and thus, the difference in height between printing surface 156 and second material edge 128 is essentially equal to the depth of recessed regions 134 shown in FIG. 1d. However, in alternate embodiments the depth to which stamp material 158 is planarized may be any depth less than the depth of second material edge 128.

Contact printing stamp 102" includes stamp protrusions 150 formed by creating stamp material 158 in recessed regions similar to that shown in recessed regions 134 illustrated in FIG. 1d of multilayer thin film structure 100'. Stamp protrusions 150, in this embodiment, may be formed by some combination of planarization and removal of first material layer to a desired depth at exposed end region 116 of multilayer thin film structure 100'. Contact printing stamp 102" also includes stamp indentations 152 where stamp protrusion height 160 is the difference in height from stamp printing surface 156 and stamp indentation 152. In this embodiment stamp indentation is formed by first material etched second edge 125 of first material layer 122. That is the material layer or layers that do not form the recessed regions may also be etched or removed, or various combinations of both, to a depth sufficient to generate printing surface 156 after stamp material 158 is created. For example, as illustrated in FIG. 1e, first material layers 122 (i.e. the layers that did not form the recessed regions) have been etched to a depth intermediate to that of second material layers 126. As described earlier for the multilayer thin film structure and the contact printing stamps the length, width, and shape of the protrusions and indentations formed may be varied and is intended to include a wide range of lengths, widths and shapes. The desired structures of contact printing stamp 102" are represented by protrusions and indentations and in particular the width, and shape shown in FIG. 1e, as well as the length (not shown) is meant for illustrative purposes only. It should also be noted that the shape to the features or structures formed in contact printing stamps 102' and 102" are directly related to the features or structures formed in multilayer thin film structure 100'.

Figure 2A:
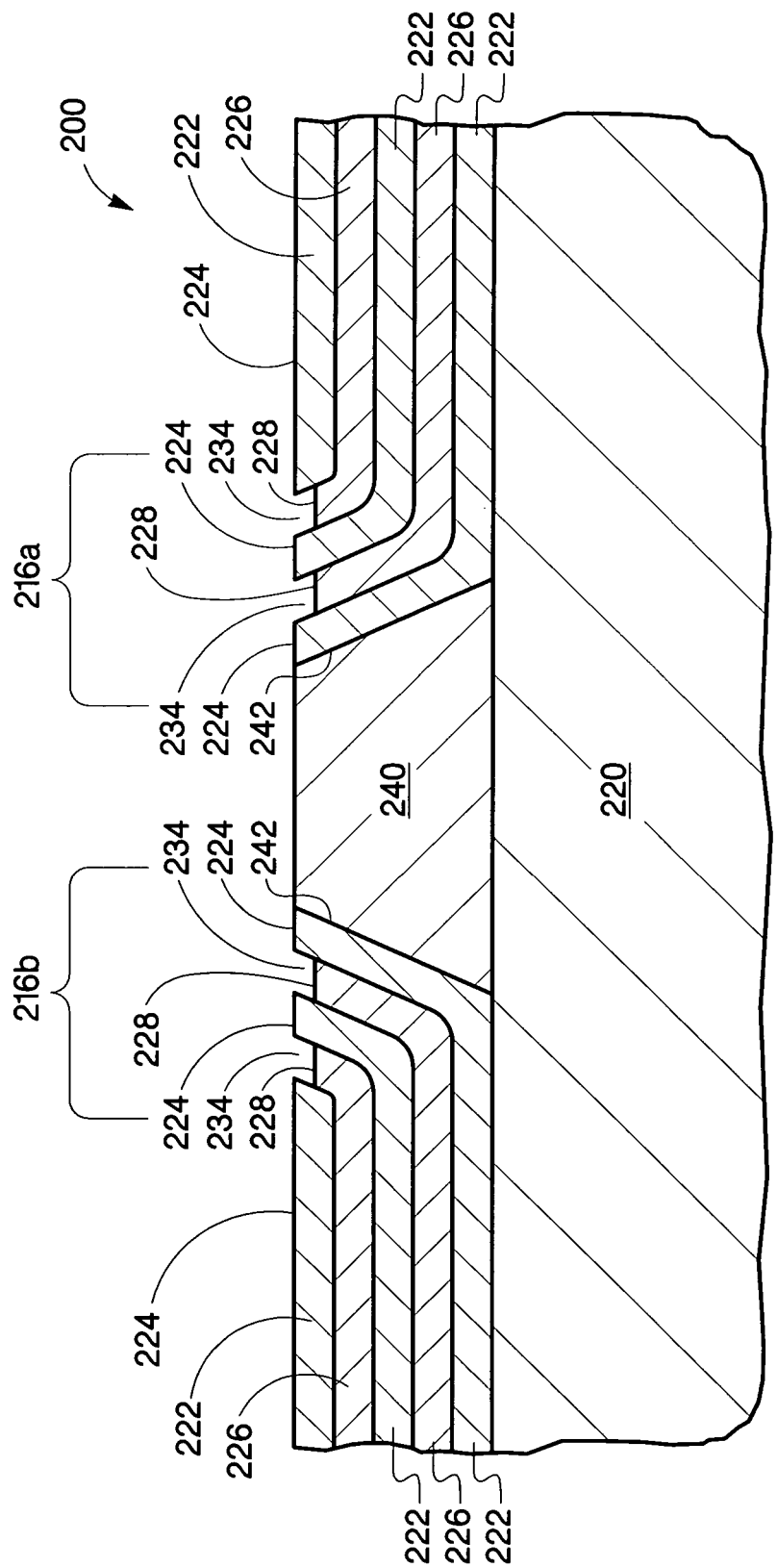
FIG. 2a is a cross-sectional view of a multilayer thin film structure according to an alternate embodiment of the present invention.

An alternate embodiment of a multilayer thin film structure that may be utilized in the present invention is shown, in a cross-sectional view, in FIG. 2a. In this embodiment, multilayer thin film structure 200 includes sidewall forming structure 240 formed on substrate 220. In this embodiment, sidewall forming structure 240 includes sidewalls 242 each forming an angle of about 60 degrees relative to the substrate surface. However, in alternate embodiments, sidewalls 242 may have any angle in the range from about ten degrees to about ninety degrees. In this embodiment, sidewall forming structure 240 is a photoresist such as SPR 3625 (Shipley Positive Resist) sold by Rohm and Haas Electronic Materials. The SPR 3625 photoresist may be heated to alter its cross-sectional shape and thereby change the angle of sidewalls 242. Through control of the time and the temperature the normally substantially vertical sidewalls obtained using conventional photolithographic processing may be altered to form a more acute angle. Generally the longer the time, or the higher the temperature or various combinations thereof lead to more acute angles. In addition, although FIG. 2a shows only one sidewall forming structure, multilayer thin film structure 200 may include many different sidewall forming structures disposed on substrate 220. These sidewall forming structures may be very thin (i.e. the distance between the sidewalls is small) allowing for exposed end regions of material layers formed on either side of the sidewall forming structures to be very close together. These structures may also be thick allowing for sets of parallel exposed edges that are far apart. In addition, these structures may also be of nearly arbitrary shape and length. The shape of these structures substantially controls the shape of the exposed material edges of the material layers formed thereon. Further, these structures can have various slopes to their sidewalls, allowing for the variation in thicknesses of the exposed edges of the multilayer thin film disposed thereon.

Multilayer thin film structure 200 also includes alternating first material layers 222 and second material layers 226 disposed on substrate 220 as shown in FIG. 2a. Although FIG. 2a shows first material layer 222 disposed on substrate 220 it should be understood that either layer may be disposed on the substrate and that other additional layers (not shown) may be disposed between the substrate and the multilayers. Multilayer thin film structure 200 also includes exposed end regions 216a and 216b that include recessed regions 234 formed in second material layer 226. Recessed regions 234 have a depth equal to the difference between first material edge 224 and second material edge 228. As described earlier for the embodiment shown in FIGS. 1a-1b, a wide variety of deposition techniques may be utilized to fabricate first and second material layers 222 and 226.

Figure 2B:
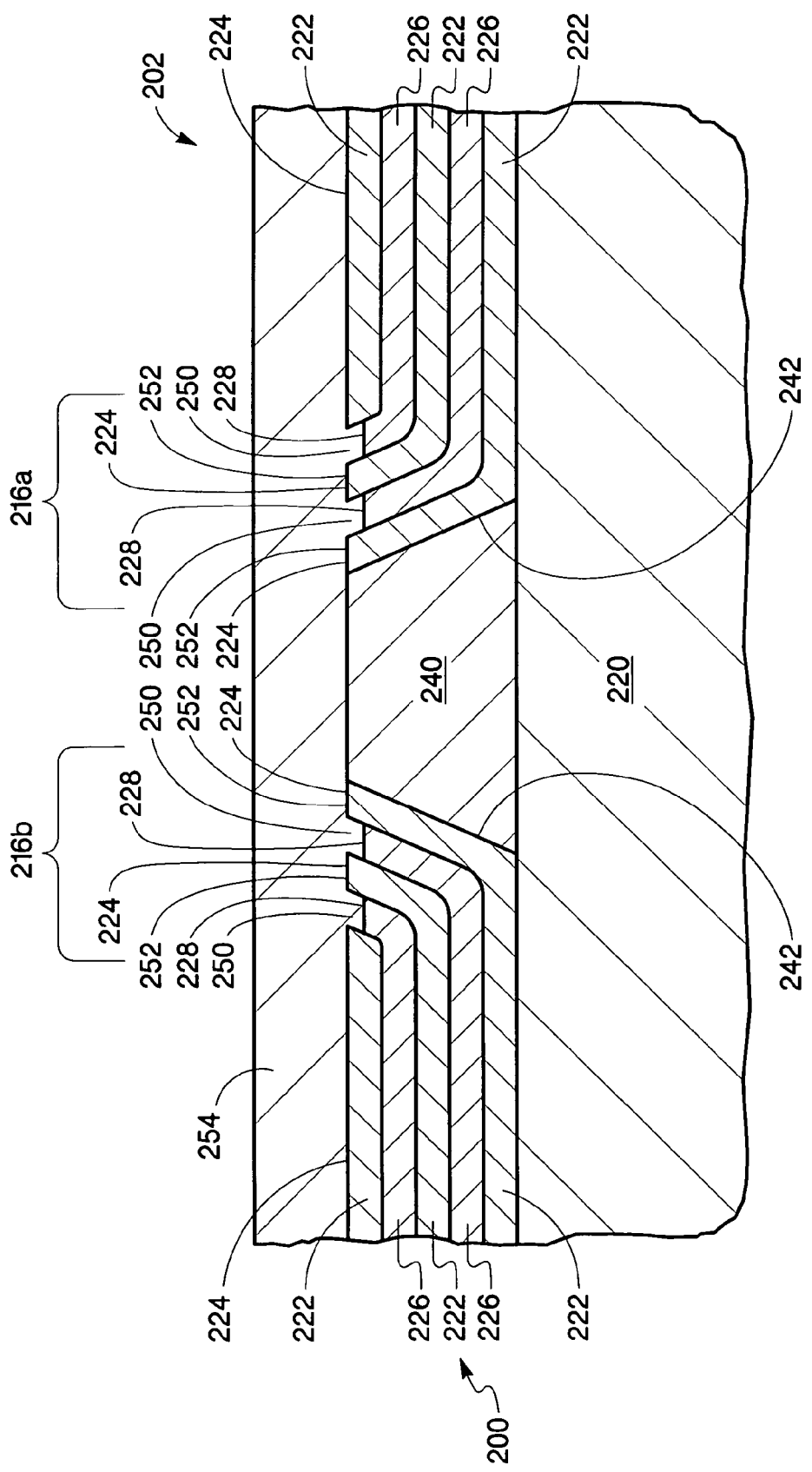

FIG. 2b, a cross-sectional view, illustrates the formation of contact printing stamp 202 on exposed end regions 216a and 216b of multilayer thin film structure 200 separated by sidewall forming structure 240. Contact printing stamp 202, in this embodiment, includes stamp protrusions 250 formed by creating a stamp material in recessed regions 234 (see FIG. 2a) of multilayer film structure 200. Stamp protrusions 250 end at second material edge 228 of multilayer thin film structure 200. Contact printing stamp 202 also includes stamp indentations 252 corresponding to first material edge 224 and stamp base 254. Thus, protrusions 250 and indentations 252 have a depth equal to the difference between first material edge 224 and second material edge 228 of multilayer thin film structure 200 from which they were formed. As described earlier the desired structures of contact printing stamp 202 are represented by protrusions and indentations and in particular the length, width, and shape shown in FIG. 2b is meant for illustrative purposes only. Contact printing stamp 202 has a substantially complementary shape to the features or structures formed in multilayer thin film structure 200.

Figure 2C:
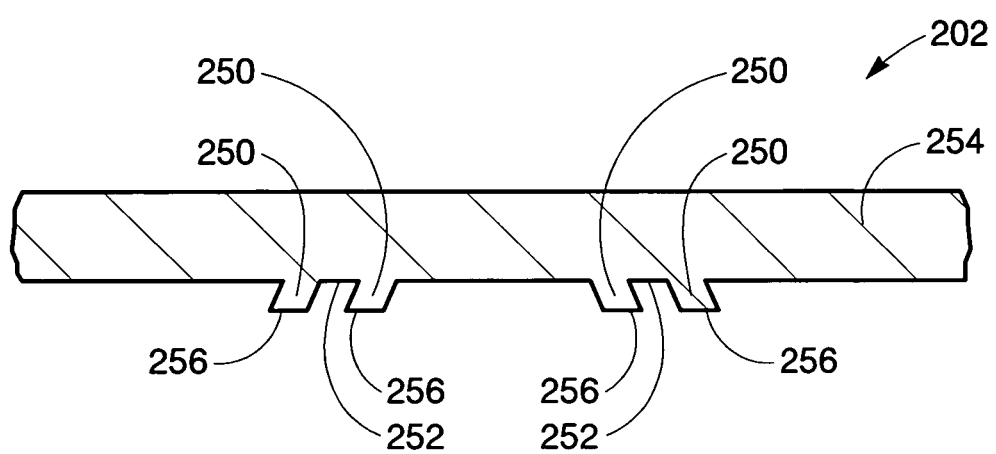
FIG. 2c is a cross-sectional view of a contact printing stamp according to an alternate embodiment of the present invention.

A cross-sectional view of contact printing stamp 202 after separation or removal from the multilayer thin film structure is shown in FIG. 2c. Contact printing stamp 202 includes protrusions 250 and indentations 252. Protrusions 250 form printing surfaces 256 through which patterning of a material surface may be carried out. As noted above the utilization of sidewall forming structures allows for nanometer scale printing features to be formed having nearly any arbitrary shape including both linear and curved shapes as well as combinations thereof. Contact printing stamp 202 also includes stamp base 254 that is essentially that portion of the stamp distal to the stamp protrusions and indentations. The material utilized to form protrusions 250 and indentations 252 as well as stamp base 254 may be any moldable material. As noted above the utilization of sidewall forming structures allows for nanometer scale printing surfaces to be formed having nearly any arbitrary shape including both linear and curved shapes as well as combinations thereof.

Figure 2D:
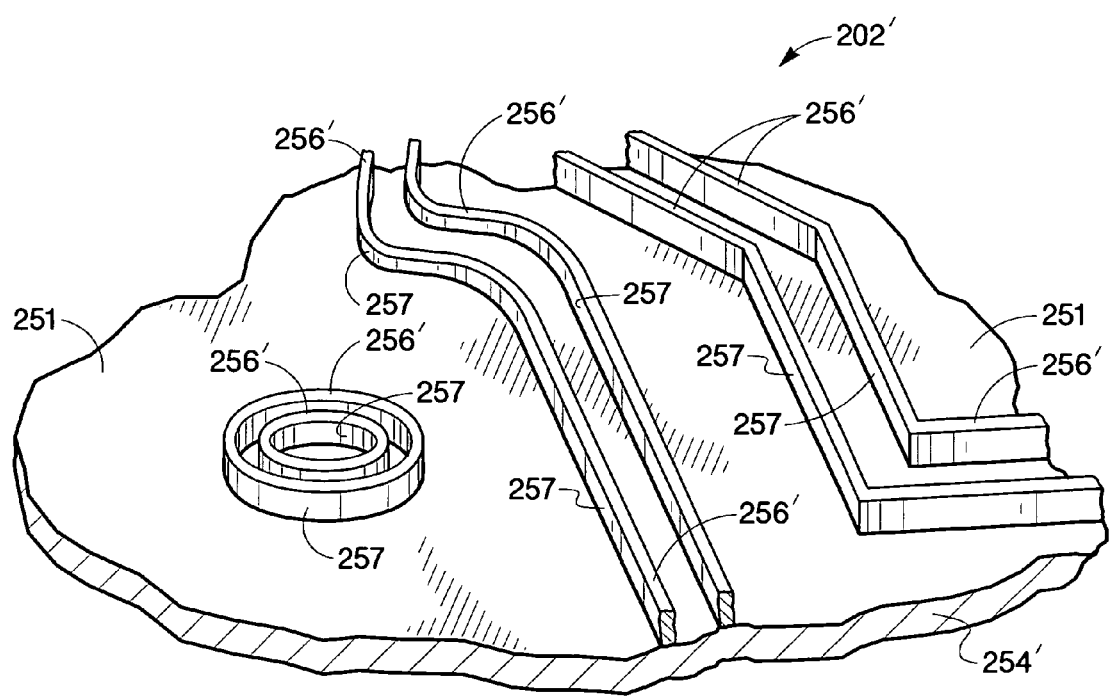
FIG. 2d is an isometric view of contact printing stamp according to an alternate embodiment of the present invention.

FIG. 2d is an isometric view of a portion of a contact printing stamp illustrating the nature of the features and thus printing surfaces that may be formed using the present invention. Contact printing stamp 202' includes printing surfaces 256' of features 257 formed on and laterally disposed across stamp base surface 251 of stamp base 254' and shows how the sidewall forming structures can be formed in a wide variety of shapes having a near-arbitrary length and curvature in virtually any lateral direction. FIG. 2d illustrates circular printing features, printing features forming a right angle and forming an acute angle, and printing features having an arbitrary curvature and co-parallel and all capable of having line widths in the range from a few nanometers to 80 nanometers and even larger. In addition, although features forming an acute and right angle are illustrated in FIG. 2d, other embodiments may utilize features forming any angle between zero and 180 degrees. For more information on sidewall forming structures see, for example, U.S. patent application Ser. No. 10/817,729 and filed on Apr. 2, 2004, entitled "Fabrication and Use of Superlattice."

Figure 3A:
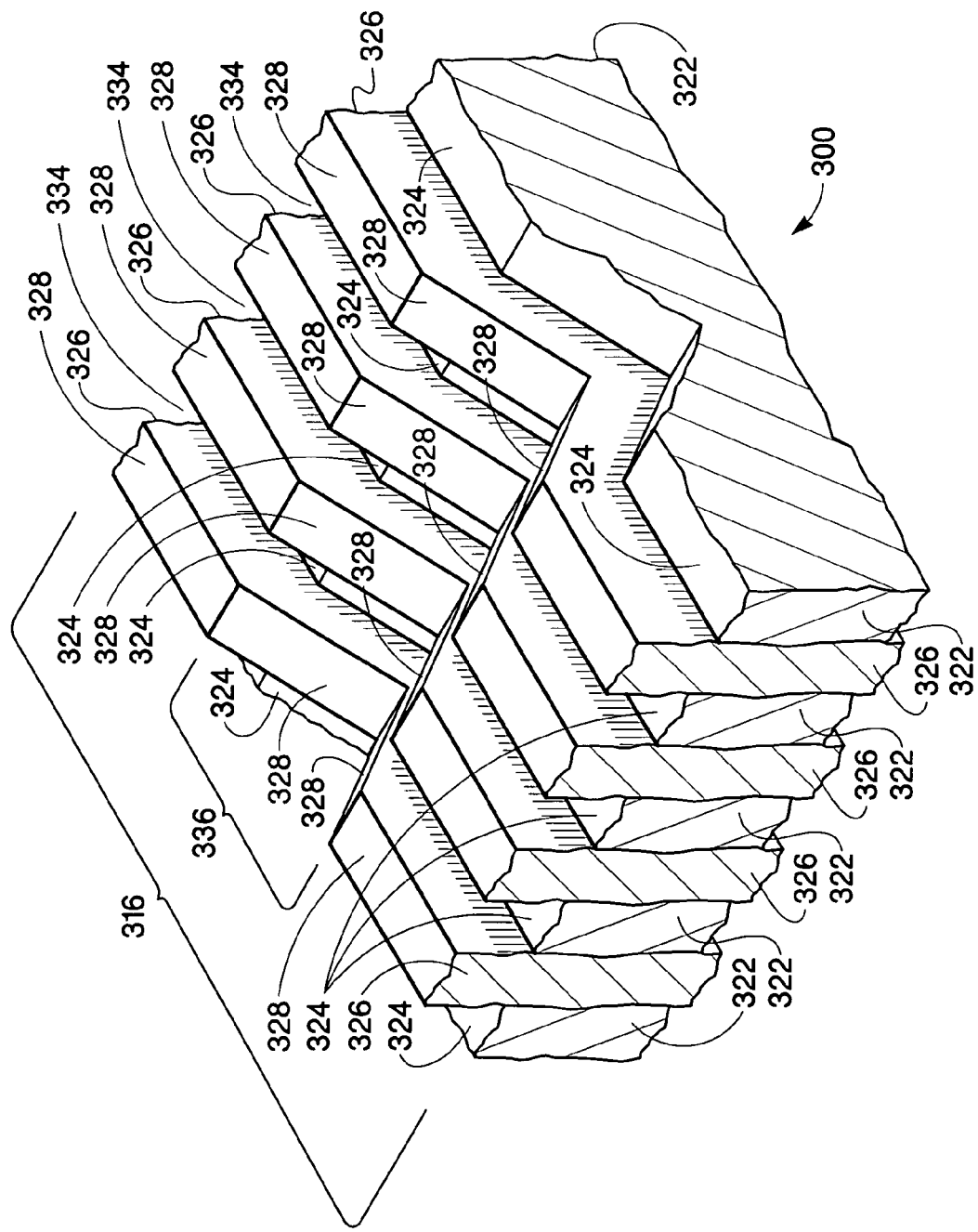
FIG. 3a is an isometric view of a multilayer thin film structure according to an alternate embodiment of the present invention.

An alternate embodiment of a multilayer thin film structure that may be utilized in the present invention is shown, in a cross-sectional view, in FIG. 3a. In this embodiment, multilayer thin film structure 300 includes v-shaped groove 336 formed across first and second material layers 322 and 326 and formed into first and second material edges 324 and 328. Multilayer thin film structure 300 also includes exposed end region 316 that includes recessed regions 334 formed in first material layer 322. In this embodiment v-shaped groove 336 is formed before recessed regions 334 are formed. Recessed regions 334, in this embodiment, have essentially a uniform depth over the length of exposed end region 316 that is equal to the difference between second material edge 328 and first material edge 324. However, in alternate embodiments, various combinations of material removal processes and v-shaped groove formation processes also may be utilized to generate various combinations of depth in the v-shaped groove and in the areas outside of the v-shaped groove.

Figure 3B:
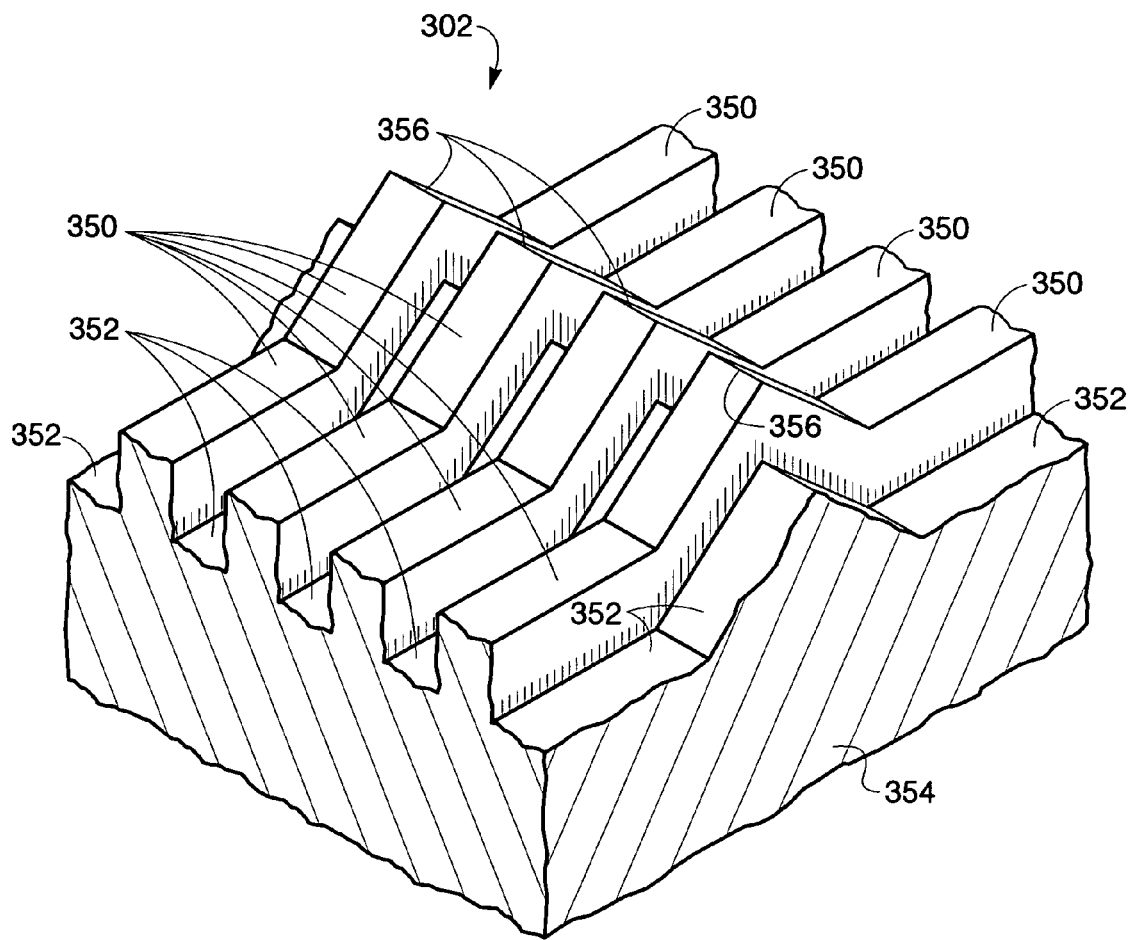
FIG. 3b is an isometric view of a contact printing stamp according to an alternate embodiment of the present invention.

An isometric view of contact printing stamp 302 after separation or removal from the multilayer thin film structure is shown in FIG. 3b. Contact printing stamp 302 includes protrusions 350 and indentations 352. In this embodiment, printing surface 356 is the thin knife edge of each protrusion formed at the apex of the complementary inverted structure formed when contact printing stamp 302 was formed utilizing the v-shaped groove formed in the multilayer thin film structure 300 (see FIG. 3a) as a mold. Such a contact printing stamp may be utilized to print arrays of nano-dots. Contact printing stamp 302 also includes stamp base 354.

Figure 4:
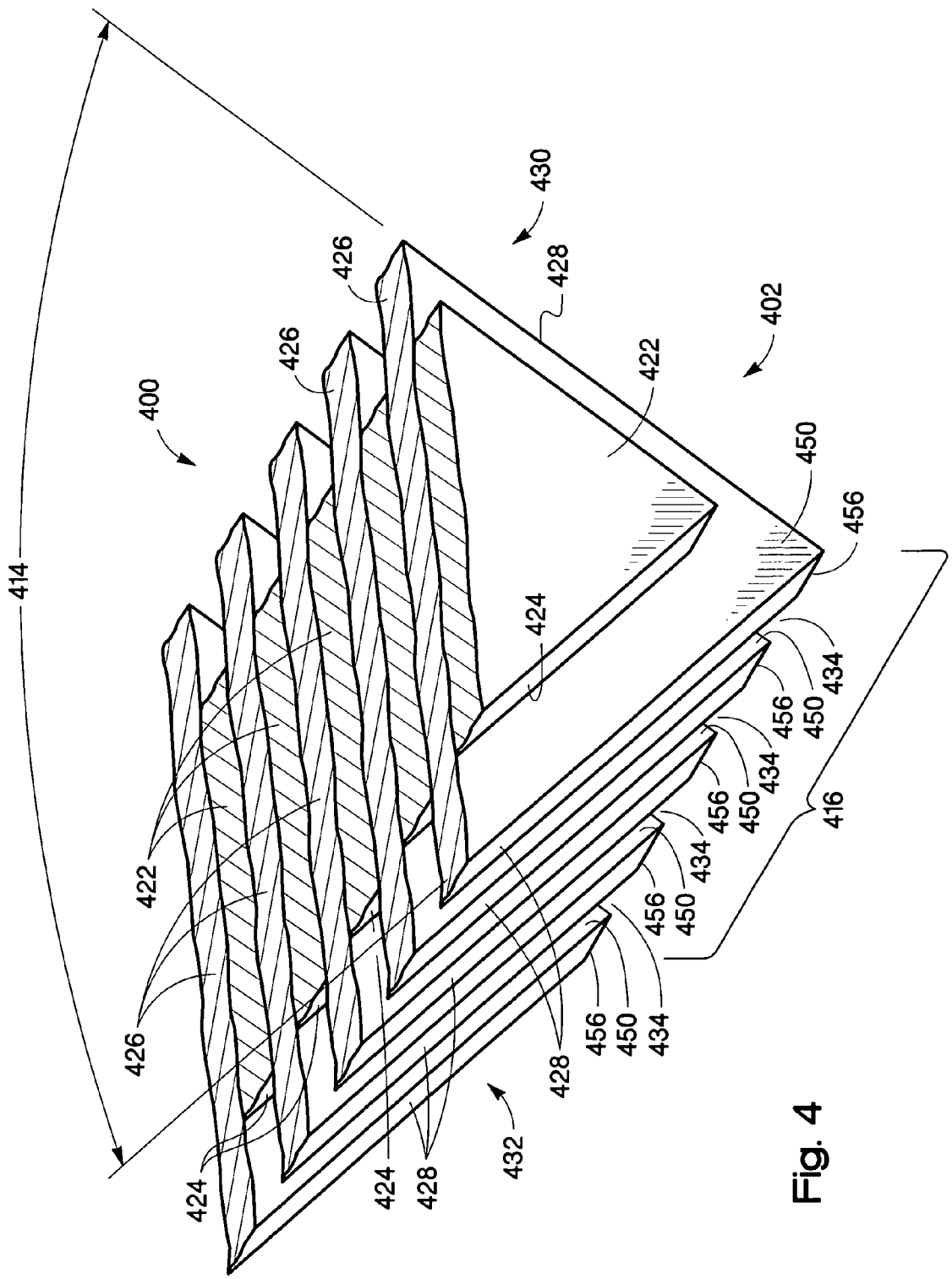
FIG. 4 is an isometric view of a contact printing stamp according to an alternate embodiment of the present invention.

An alternate embodiment of a multilayer thin film structure that may be utilized in the present invention is shown, in an isometric view, in FIG. 4. In this embodiment, multilayer thin film structure 400 includes first and second adjacent sides 430 and 432 planarized and at an angle 414. Multilayer thin film structure 400 also includes exposed end region 416 that includes recessed regions 434 formed in first material layer 422. Recessed regions 434 have essentially a uniform depth over the length of exposed end region 416 that is equal to the difference between second material edge 428 of second material layer 426 and first material edge 424 of first material layer 422. In this embodiment multilayer thin film structure 400 forms contact printing stamp 402 and second material layer 426 forms stamp protrusions 450 and first material edge 424 forms stamp indentations 452. Printing surface 456 is formed where the thin knife edge generated where first and second adjacent sides 430 and 432 meet. Such a contact printing stamp may be utilized to print arrays of nano-dots. In an alternate embodiment contact printing stamp 402 may be formed similar to the embodiments shown in FIGS. 1d and 1e where a stamp material is formed in recessed regions 434 and either the excess material that extends beyond second material 428 is utilized to form the knife edge printing surfaces or the stamp material may be formed in recessed regions 434 with subsequent planarizing and etching of second material layer to form the knife edge printing surfaces.

What is claimed is:

1. A method of forming a contact printing stamp, comprising:
    creating an exposed end-region of a multilayer thin film structure, wherein said exposed end region forms a minor surface and a plurality of alternating layers of a first material and a second material;
    removing said first material to a pre-selected depth below said minor surface to form a plurality of recessed regions in the exposed end-region of the multilayer thin-film structure;
    forming an excess of stamp material in the plurality of recessed regions extending above said minor surface, said excess having a width substantially equal to a recessed region width, said stamp material having a printing surface adapted to transfer a transfer material.

2. The method in accordance with claim 1, wherein forming said excess of stamp material in said plurality of recessed regions further comprises forming said excess of said stamp material in said plurality of recessed regions having a width less than about 80 nanometers.

3. The method in accordance with claim 1, further comprising:
    forming a plurality of first material layers having a first material layer major surface and a first material layer thickness; and
    forming a plurality of second material layers alternating with said plurality of first material layers, said second material layers having a second material layer major surface and a second material layer thickness, wherein said first plurality and said second plurality form at least a portion of said multilayer thin film structure.

4. The method in accordance with claim 3, wherein forming said plurality of first and second material layers further comprises forming said plurality of first and second material layers from dissimilar materials having a differential material removal rate.

5. The method in accordance with claim 3, wherein said first and said second material layer major surfaces are substantially parallel to a substrate major surface.

6. The method in accordance with claim 3, wherein said first material layer thickness or said second material layer thickness or both varies.

7. The method in accordance with claim 3, wherein each of said plurality of recessed regions further comprises a recessed region width substantially equal to either said first material layer thickness or said second material layer thickness.

8. The method in accordance with claim 3, further comprising forming the minor surface of said plurality of first and second material layers, said minor surface being substantially normal to said first and said second material layer major surfaces.

9. The method in accordance with claim 8, further comprising removing a portion of said plurality of first material layers to the specified depth substantially normal to said first and said second material layer major surfaces and substantially parallel to said minor surface.

10. The method in accordance with claim 9, wherein removing said portion further comprises etching with an etchant that etches said plurality of first material layers at a rate different from said plurality of second material layers.

11. The method in accordance with claim 10, wherein etching with said etchant further comprises chemical etching.

12. The method in accordance with claim 9, wherein removing said portion further comprises removing said portion to a depth within the range of about 2 nanometers to about three hundred nanometers.

13. The method in accordance with claim 3, wherein forming either said plurality of first or said plurality of second material layers further comprises:
    forming either said plurality of first or said plurality of second material layers from an anodizable metal, and
    anodizing said anodizable metal to a pre-selected depth, wherein an oxide is electrochemically formed.

14. The method in accordance with claim 13, further comprising removing said oxide.

15. The method in accordance with claim 8, further comprising forming an excess of said stamp material extending above said minor surface, said excess having a width substantially equal to said recessed region width.

16. The method in accordance with claim 3, further comprising:
    forming a minor surface of said plurality of first and second material layers, said minor surface substantially normal to said first and said second material layer major surfaces;
    forming a second minor surface of said plurality of first and second material layers said second minor surface normal to said first and said second material layer major surfaces, wherein said minor surface and said second minor surface meet at an acute angle
    forming either said plurality of first or said plurality of second material layers from an anodizable metal;
    anodizing said anodizable metal to a pre-selected depth, wherein an oxide is electrochemically formed;
    removing said oxide;
    forming a v-shaped groove in said minor surface and parallel to said first and said second material layer major surfaces;
    filling said v-shaped groove with said stamp material; and
    forming a plurality of thin knife edge protrusions at the apex of said v-shaped groove.

17. The method in accordance with claim 8, further comprising forming a v-shaped groove in said minor surface and parallel to said first and said second material layer major surfaces.

18. The method in accordance with claim 17, further comprising:
    filling said v-shaped groove with said stamp material; and
    forming a plurality of thin knife edge protrusions at the apex of said v-shaped groove.

19. The method in accordance with claim 3, further comprising:
    forming a minor surface of said plurality of first and second material layers, said minor surface substantially normal to said first and said second material layer major surfaces; and further comprising:
    forming at least one sidewall forming structure on a substrate, said sidewall forming structure having at least one sidewall and a top portion, and said substrate having a substrate major surface;
    forming a plurality of first material layers disposed over said substrate, said at least one sidewall, and said top portion, said plurality of first material layers having a first material layer thickness;
    forming a plurality of second material layers disposed over said substrate, said at least one sidewall, and said top portion, said plurality of first material layers alternating with said plurality of second material layers and having a second material layer thickness, wherein said plurality of first and second material layers forms a portion of said multilayer thin film structure;
    planarizing said plurality of first and second material layers to at least said top portion to form a minor surface of said multilayer thin film structure, wherein said minor surface is parallel to said substrate major surface and forms said exposed end region;
    forming a plurality of stamping surfaces disposed on a plurality of stamp protrusions, wherein at least one stamp protrusion has either a printing feature having at least a portion forming a curved shape in at least one lateral dimension, or two printing features meeting at an angle less than 180 degrees in at least one lateral dimension, or both, wherein said exposed end-region forms said plurality of stamp protrusions to form a printing surface of the contact printing stamp.

20. The method in accordance with claim 3, further comprising forming a minor surface of said plurality of first and second material layers, said minor surface forming an angle to said first and said second material layer major surfaces.

21. The method in accordance with claim 20, further comprising planarizing said minor surface.

22. The method in accordance with claim 3, further comprising forming at least two minor surfaces of said plurality of first and second material layers normal to said first and said second material layer major surfaces, wherein said at least two minor surfaces meet at an acute angle.

23. The method in accordance with claim 22, planarizing said at least two minor surfaces.

24. The method in accordance with claim 3, further comprising:
    forming a minor surface of said plurality of first and second material layers, said minor surface substantially normal to said first and said second material layer major surfaces;
    forming at least one sidewall forming structure on a substrate, said sidewall forming structure having at least one sidewall and a top portion, and said substrate having a substrate major surface;
    forming a plurality of first material layers disposed over said substrate, said at least one sidewall, and said top portion, said plurality of first material layers having a first material layer thickness;
    forming a plurality of second material layers disposed over said substrate, said at least one sidewall, and said top portion, said plurality of first material layers alternating with said plurality of second material layers and having a second material layer thickness, wherein said plurality of first and second material layers forms a portion of said multilayer thin film structure; and
    forming said stamp material in a plurality of sidewall recessed regions formed substantially adjacent to said sidewall forming structure, wherein said sidewall forming structure includes at least a first portion of said sidewall forming structure having a curved shape in a lateral direction, said sidewall forming structure having a second portion of said sidewall forming structure having at least two linear shapes meeting at a right angle in a lateral direction, said sidewall forming structure having a third portion of said sidewall forming structure having at least linear shapes meeting at a right angle in a lateral direction, and said sidewall forming structure having a fourth portion of said sidewall forming structure having at least two additional linear shapes meeting at an angle less than 180 degrees in a lateral direction, wherein said curved shape includes at least one lateral dimension less than about 80 nanometers, where in said at least two linear shapes includes at least one lateral dimension less than about 80 nanometers.

25. The method in accordance with claim 1, further comprising:
    forming at least one sidewall forming structure on a substrate, said sidewall forming structure having at least one sidewall and a top portion, and said substrate having a substrate major surface;
    forming a plurality of first material layers disposed over said substrate, said at least one sidewall, and said top portion, said plurality of first material layers having a first material layer thickness; and
    forming a plurality of second material layers disposed over said substrate, said at least one sidewall, and said top portion, said plurality of first material layers alternating with said plurality of second material layers and having a second material layer thickness, wherein said plurality of first and second material layers forms a portion of said multilayer thin film structure.

26. The method in accordance with claim 25, planarizing said plurality of first and second material layers to at least said top portion to form a minor surface of said multilayer thin film structure, wherein said minor surface is parallel to said substrate major surface and forms said exposed end region.

27. The method in accordance with claim 1, further comprising:
forming a plurality of first material layers having a first material layer major surface and a first material layer thickness;
forming a plurality of second material layers alternating with said plurality of first material layers, said second material layers having a second material layer major surface and a second material layer thickness, wherein said first plurality and said second plurality of material layers form a plurality of alternating layers of two dissimilar materials, said first plurality and said second plurality of material layers disposed over a first portion of a substrate to form a stack, said dissimilar materials having a differential material removal rate, wherein said first plurality and said second plurality form at least a portion of said multilayer thin film structure, wherein said first and said second material layer major surfaces are substantially parallel to a substrate major surface over said first portion of said substrate;
forming a minor surface of said plurality of first and second material layers, said minor surface substantially normal to said first and said second material layer major surfaces, whereby an end region minor surface is formed in said exposed end region of said plurality of alternating layers of said first material and said second material;
planarizing said end region minor surface of said plurality of first and second material layers;
removing a portion said plurality of first material layers to a specified depth substantially normal to said first and said second material layer major surfaces and substantially parallel to said minor surface, with an etchant that etches at said differential material removal rate, thereby removing said portion to a depth within the range of about 2 nanometers to about three hundred nanometers, wherein each of said plurality of recessed regions has a recessed region width substantially equal to either said first material layer thickness or said second material layer thickness;
forming the excess of said stamp material extending above said minor surface, said excess having a width substantially equal to said recessed region width;
planarizing said excess stamp material to at least said minor surface;
forming at least one sidewall forming structure on a second portion of said substrate, said sidewall forming structure having at least one sidewall and a top portion;
forming said plurality of first material layers disposed over said second portion of said substrate, disposed over said at least one sidewall, and disposed over said top portion;
forming said plurality of second material layers disposed over said second portion of said substrate, disposed over said at least one sidewall, and disposed over said top portion, said plurality of first material layers alternating with said plurality of second material layers, wherein said plurality of first and second material layers forms a second portion of said multilayer thin film structure;
wherein creating said stamp material further comprises creating said stamp material in a plurality of sidewall recessed regions formed substantially adjacent to said sidewall forming structure;
planarizing said plurality of first and second material layers disposed over said second portion of said substrate to at least said top portion to form a sidewall minor surface of said multilayer thin film structure, wherein said sidewall minor surface is parallel to said substrate major surface and forms a sidewall end region said sidewall forming structure having at least a portion of said sidewall forming structure having at least two linear shapes meeting at an acute angle in a lateral direction and at least a portion of said sidewall forming structure having a curved portion;
forming a first printing feature wherein at least a portion of said printing feature includes a curved shape;
forming a second and a third printing feature wherein said second printing feature intersects said third printing feature at an angle less than about 180 degrees; and
urging said recessed regions and said sidewall recessed regions into said stamp material;
wherein said plurality of recessed regions and said sidewall recessed regions have a width less than about 80 nanometers.

28. The method in accordance with claim 1, further comprising forming a plurality of alternating layers of two dissimilar materials disposed over a substrate to form a stack having a major surface parallel to a substrate major surface, said plurality of alternating layers including a first material layer having a first thickness and a second material layer having a second thickness, wherein said first and said second material layers alternate.

29. The method in accordance with claim 28, wherein said first thickness differs from said second thickness.

30. The method in accordance with claim 28, wherein said first thickness varies in a predetermined manner.

31. The method in accordance with claim 28, further comprising forming a minor surface of said plurality of first and second material layers normal to said substrate major surface.

32. The method in accordance with claim 31, further comprising removing a portion of either said first material layer or said second material layer a pre-selected depth on said minor surface.

33. The method in accordance with claim 32, wherein removing said portion of either said first material layer or said second material layer further comprises etching said exposed end-region with an etchant that etches said first material layer at a rate different from said second material layer.

34. The method in accordance with claim 33, wherein etching with said etchant further comprises chemical etching.

35. The method in accordance with claim 32, wherein removing said portion to a pre-selected further comprises removing said portion to a depth within the range of a few nanometers to about three hundred nanometers.

36. The method in accordance with claim 28, wherein forming said plurality of alternating layers of two dissimilar materials further comprises:
forming either said first or said second material layers from an anodizable metal; and
anodizing said anodizable metal to a pre-selected depth, wherein an oxide is electrochemically formed.

37. The method in accordance with claim 36, further comprising removing said oxide.

38. The method in accordance with claim 31, further comprising forming a v-shaped groove in said minor surface and parallel to said stack major surface.

39. The method in accordance with claim 38, further comprising:
  filling said v-shaped groove with said stamp material; and
  forming a plurality of thin knife edge protrusions at the apex of said v-shaped groove.

40. The method in accordance with claim 1, further comprising planarizing said excess of said stamp material.

41. The method in accordance with claim 40, further comprising planarizing said excess of said stamp material to at least said minor surface.

42. The method in accordance with claim 1, further comprising removing said second material to a pre-selected depth below said minor surface, wherein stamp indentations are formed.

43. The method in accordance with claim 1, wherein forming said excess of stamp material further comprises forming said excess of stamp material in said plurality of recessed regions formed substantially adjacent to a sidewall forming structure.

44. The method in accordance with claim 43, further comprising creating said sidewall forming structure having at least a portion of said sidewall forming structure having a curved shape in a lateral direction.

45. The method in accordance with claim 43, further comprising creating said sidewall forming structure having at least a portion of said sidewall forming structure having at least two linear shapes meeting at an acute angle in a lateral direction.

46. The method in accordance with claim 43, further comprising creating said sidewall forming structure having at least a portion of said sidewall forming structure having at least two linear shapes meeting at a right angle in a lateral direction.

47. The method in accordance with claim 43, further comprising creating said sidewall forming structure having at least a portion of said sidewall forming structure having at least two linear shapes meeting at an angle less than 180 degrees in a lateral direction.

48. The method in accordance with claim 1, further comprising forming a printing feature wherein at least a portion of said printing feature includes a curved shape.

49. The method in accordance with claim 48, wherein said curved shape includes at least one lateral dimension less than about 80 nanometers.

50. The method in accordance with claim 1, further comprising forming a first and a second printing feature wherein said first printing feature intersects said second printing feature at an angle less than about 180 degrees.

51. The method in accordance with claim 50, wherein said first and said second printing features include at least one lateral dimension less than about 80 nanometers.

52. The method in accordance with claim 1, wherein creating said stamp material in a plurality of recessed regions further comprises forming printing features complementary to a plurality of features formed in said multilayer thin film structure.

* * * * *